United States Patent
Kim et al.

(10) Patent No.: US 8,000,093 B2
(45) Date of Patent: Aug. 16, 2011

(54) DISPLAY DEVICE, MANUFACTURING METHOD OF THE DISPLAY DEVICE, AND PORTABLE COMPUTER HAVING THE DISPLAY DEVICE

(75) Inventors: Kwan-ho Kim, Cheonan-si (KR); Man-sung Kim, Suwon-si (KR)

(73) Assignee: Samsung Electronics Co., Ltd., Suwon-Si, Gyeonggi-Do (KR)

( * ) Notice: Subject to any disclaimer, the term of this patent is extended or adjusted under 35 U.S.C. 154(b) by 328 days.

(21) Appl. No.: 12/168,643

(22) Filed: Jul. 7, 2008

(65) Prior Publication Data

US 2009/0129005 A1    May 21, 2009

(30) Foreign Application Priority Data

Nov. 19, 2007    (KR) .................. 10-2007-0118070

(51) Int. Cl.
  G06F 1/16    (2006.01)
  H05K 1/00    (2006.01)
  H05K 9/00    (2006.01)
  G02F 1/1333  (2006.01)

(52) U.S. Cl. .............. 361/679.21; 361/679.24; 361/748; 361/816; 361/818; 349/58

(58) Field of Classification Search .. 361/679.21–679.3, 361/748, 792–795, 816–818; 349/58–60; 439/95, 939, 607.13, 607.01, 62; 174/255, 174/260

See application file for complete search history.

(56) References Cited

U.S. PATENT DOCUMENTS

| 5,587,887 | A * | 12/1996 | Price et al. ................. 361/794 |
| 6,211,457 | B1 * | 4/2001 | Cama et al. ................. 174/380 |
| 7,518,669 | B2 * | 4/2009 | Jang ............................ 349/58 |
| 2004/0257515 | A1 * | 12/2004 | Lee ............................. 349/150 |
| 2005/0026499 | A1 * | 2/2005 | Choi ........................... 439/607 |
| 2005/0194900 | A1 | 9/2005 | Kim et al. |
| 2005/0194913 | A1 | 9/2005 | Kim et al. |

FOREIGN PATENT DOCUMENTS

| JP | 2003066483 | 3/2003 |
| JP | 2004-213021 | 7/2004 |
| JP | 2005-215555 | 8/2005 |

(Continued)

OTHER PUBLICATIONS

English Abstract for Publication No. 1019980067764.

(Continued)

Primary Examiner — Jayprakash N Gandhi
Assistant Examiner — Nidhi Desai
(74) Attorney, Agent, or Firm — F. Chau & Associates, LLC

(57) ABSTRACT

A display device includes a display panel, and a chassis supporting the display panel, and including a conductive material. The display device includes a circuit board including a signal wiring connected to the display panel to apply a driving signal to the display panel, and a grounding wiring for grounding. The display device includes a connector connected with a signal cable that applies an external signal and is connected to the signal wiring and the grounding wiring of the circuit board. The display device includes an exposed grounding unit exposing part of the grounding wiring on the circuit board, wherein the exposed grounding unit is disposed adjacent to the connector. The display device includes a conductive member which connects the exposed grounding unit with the chassis.

14 Claims, 7 Drawing Sheets

FOREIGN PATENT DOCUMENTS

| | | |
|---|---|---|
| JP | 2007-058180 | 3/2007 |
| JP | 2007-199501 | 8/2007 |
| KR | 1019980067764 | 10/1998 |
| KR | 1020060070871 | 6/2006 |
| KR | 1020060076427 | 7/2006 |
| KR | 1020060090392 | 8/2006 |
| KR | 1020060112142 | 10/2006 |
| KR | 1020060122226 | 11/2006 |
| KR | 1020060122296 | 11/2006 |
| KR | 1020070066116 | 6/2007 |

OTHER PUBLICATIONS

English Abstract for Publication No. JP2003066483.

English Abstract for Publication No. 2004-213021.

English Abstract for Publication No. 2005-215555.

English Abstract for Publication No. 1020060070871.

English Abstract for Publication No. 1020060076427.

English Abstract for Publication No. 1020060090392.

English Abstract for Publication No. 1020060112142.

English Abstract for Publication No. 1020060122296.

English Abstract for Publication No. 1020060122226.

English Abstract for Publication No. 2007-058180.

English Abstract for Publication No. 1020070066116.

English Abstract for Publication No. 2007-199501.

* cited by examiner

DISPLAY DEVICE, MANUFACTURING METHOD OF THE DISPLAY DEVICE, AND PORTABLE COMPUTER HAVING THE DISPLAY DEVICE

CROSS-REFERENCE TO RELATED APPLICATION

This application claims priority from Korean Patent Application No. 10-2007-0118070, filed on Nov. 19, 2007 in the Korean Intellectual Property Office, the disclosure of which is herein incorporated by reference in its entirety.

BACKGROUND OF THE INVENTION

1. Field of the Invention

The present invention relates to a display device, a manufacturing method of the display device, and a portable computer having the display device.

2. Description of Related Art

Conventional cathode ray tubes (CRTs) have been widely replaced by flat panel display devices such as liquid crystal displays (LCDs), plasma display panels (PDPs), organic light emitting devices (OLEDs), etc.

The flat panel display devices include a display panel displaying an image, and a circuit board applying data signals to the display panel. The circuit board receives image signals through an external signal cable, converts the image signals into the data signals, and applies the data signals to the display panel.

A connector to which the signal cable is connected is mounted to the circuit board.

When the signal cable is connected to the connector, and external signals including the image signals are applied thereto, electromagnetic interference (EMI) is generated in the connector.

When a portable computer mounted with the display device uses a wireless wide area network (WWAN), significant noise is detected in a communication antenna due to the EMI generated in the connector.

SUMMARY OF THE INVENTION

According to an embodiment of the present invention, a display device includes a display panel, a chassis supporting the display panel, and comprises a conductive material, a circuit board comprising a signal wiring which is connected to the display panel to apply a driving signal to the display panel, and a grounding wiring for grounding, a connector connected to a signal cable that applies an external signal, and is connected to the signal wiring and the grounding wiring of the circuit board, an exposed grounding unit exposing part of the grounding wiring on the circuit board, wherein the exposed grounding unit is disposed adjacent to the connector, and a conductive member which connects the exposed grounding unit with the chassis.

The connector may include a housing, wherein at least a part of the housing may be formed of a conductive material, wherein the conductive member may be connected with the conductive material of the housing.

The connector may further include a grounding pin which is connected with the grounding wiring of the circuit board and the conductive material of the housing.

The conductive member may include an aluminum tape.

The display device may further include an insulating member provided between the circuit board and the conductive member.

The display device may further include a mold unit which is provided to a rear side of the display panel to support the display panel, wherein the insulating member may include an insulating tape connecting the circuit board to a rear surface of the mold unit.

The circuit board may include a plurality of metal layers, and the grounding wiring, which is formed with the exposed grounding unit, may be formed in a metal layer of the plurality of metal layers which is most adjacent to the conductive member.

An area of the exposed grounding unit may be greater than or equal to an area of a rear surface of the connector.

The chassis may be formed along a circumference around the display panel.

According to an embodiment of the present invention, a manufacturing method of a display device includes providing a display panel, a circuit board which is connected with the display panel, and a connector which is mounted on the circuit board, and an exposed grounding unit on the circuit board exposing a part of a grounding wiring of the circuit board adjacent to the connector, providing a mold unit to a rear side of the display panel, and disposing the circuit board to a rear surface of the mold unit, disposing an insulating member on the circuit board, the insulating member disposed between the exposed grounding unit and a chassis supporting the display panel, and providing a conducting member connecting the chassis and the exposed grounding unit.

The connector may include a housing, wherein at least a part of the housing is formed of a conductive material, and the manufacturing method of the display device may further include connecting the conductive member with the conductive material of the housing.

The insulating member may include an insulating tape which is attached to the circuit board and a rear surface of the mold unit wherein the connector and the exposed grounding unit may be exposed.

According to an embodiment of the present invention, a portable computer includes a computer main body, a display which is rotatably coupled to the computer main body, a signal cable which extends from the computer main body, and a display device which is mounted to the display. The display device includes a display panel, a chassis supporting the display panel, and includes a conductive material, a circuit board comprising a signal wiring which is connected to the display panel to apply a driving signal to the display panel, and a grounding wiring for grounding, a connector connected with the signal cable, and is connected to the signal wiring and the grounding wiring of the circuit board, an exposed grounding unit exposing part of the grounding wiring on the circuit board, wherein the exposed grounding unit is disposed adjacent to the connector, and a conductive member which connects the exposed grounding unit with the chassis.

The connector may include a housing, wherein at least a part of the housing may be formed of a conductive material, and the conductive member may be connected with the conductive material of the housing.

The connector may further include a connecting terminal connected with the signal cable, a signal pin connected to the signal wiring of the circuit board, and a grounding pin connected with the grounding wiring of the circuit board and the conductive material of the housing.

The conductive member may include an aluminum tape.

The portable computer may further include an insulating member provided between the circuit board and the conductive member chassis.

The portable computer may further include a mold unit which is provided to a rear side of the display panel, the mold unit supporting the display panel, wherein the insulating member may include an insulating tape connecting the circuit board to a rear surface of the mold unit.

The circuit board may include a plurality of metal layers, and the grounding wiring formed with the exposed grounding unit may be formed in a metal layer of the plurality of metal layers which is most adjacent to the conductive member.

BRIEF DESCRIPTION OF THE DRAWINGS

The present invention will become apparent and more readily appreciated from the following description of exemplary embodiments, taken in conjunction with the accompanying drawings, in which.

DETAILED DESCRIPTION OF EXEMPLARY EMBODIMENTS

Figure 1:
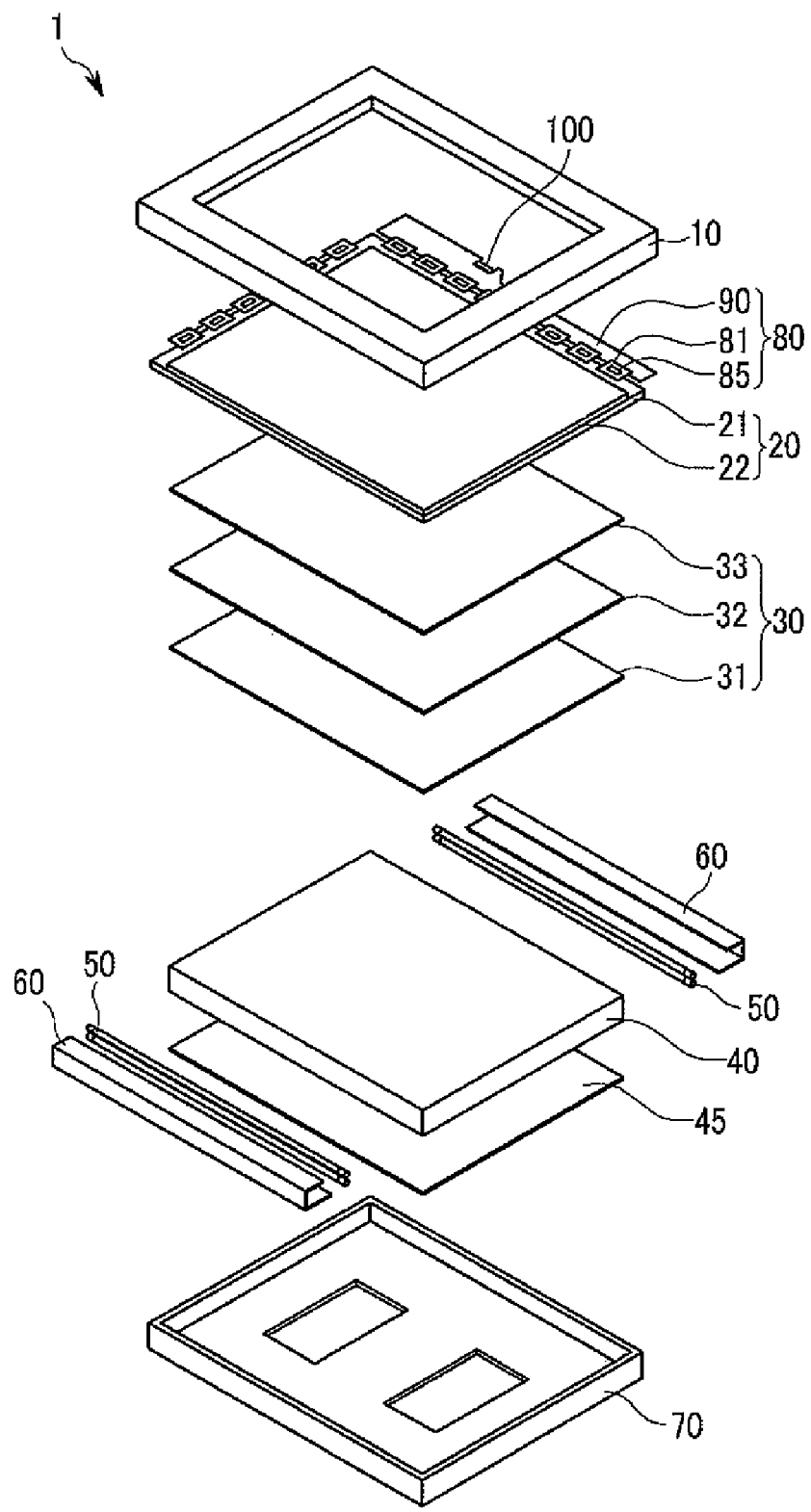
FIG. 1 is an exploded perspective view of a display device according to an exemplary embodiment of the present invention.

Reference will now be made in detail to embodiments of the present invention, examples of which are illustrated in the accompanying drawings, wherein like reference numerals refer to like elements throughout. Exemplary embodiments are described below so as to explain the present invention by referring to the figures.

In the following exemplary embodiments according to the present invention, a liquid crystal display device is described as a display device, but the present invention is not defined thereto. Alternatively, the present invention may be applied to an organic light emitting diode (OLED), a plasma display panel (PDP), etc.

Hereinafter, a display device according to an exemplary embodiment of the present invention will be described by referring to FIGS. 1 and 2.

Figure 2:
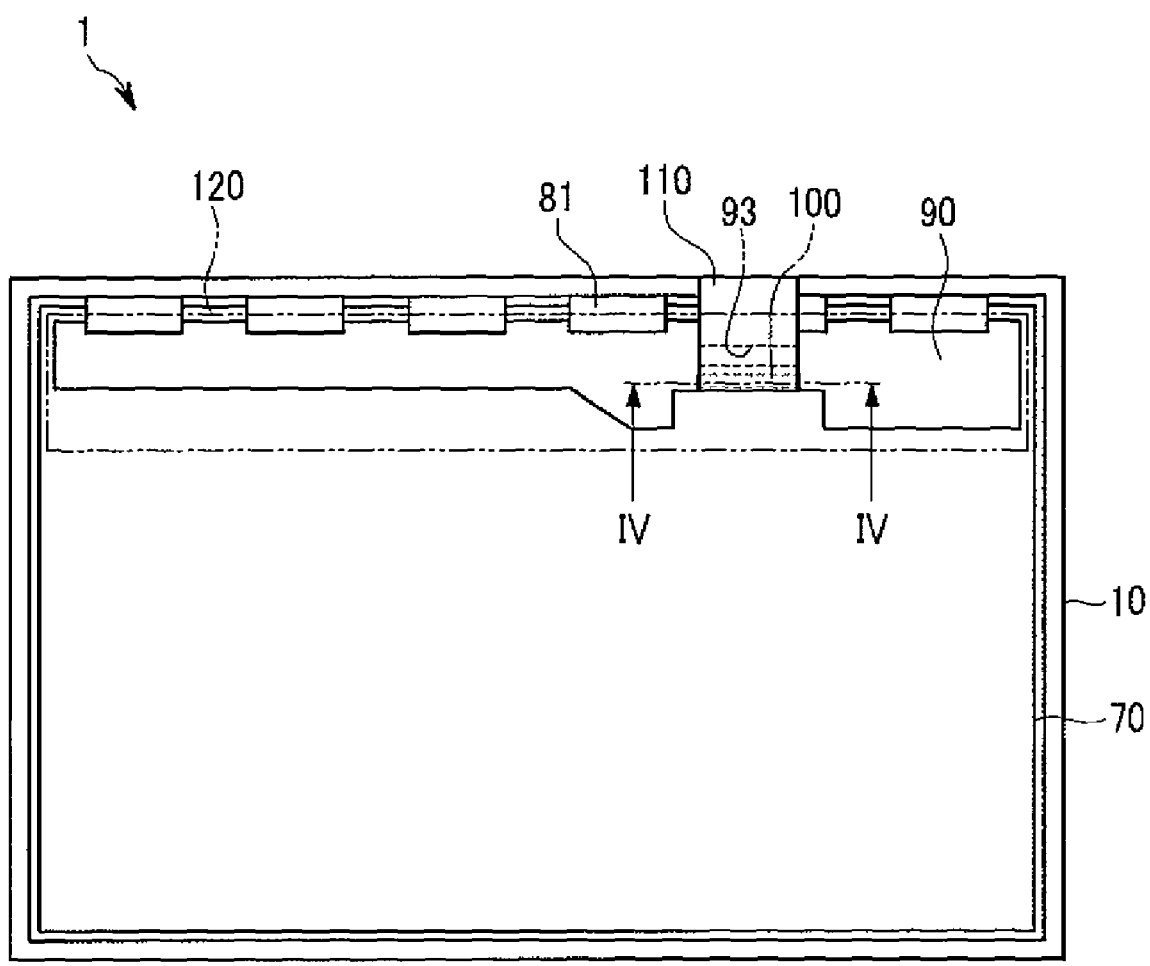
FIG. 2 is a rear view of the display device in FIG. 1.

FIG. 1 is an exploded perspective view of a display device according to an exemplary embodiment of the present invention, and FIG. 2 is a rear view of the display device in FIG. 1.

A display device 1 according to an exemplary embodiment of the present invention includes a display panel 20, an optical film unit 30 disposed to a rear portion of the display panel 20, a light guide plate 40 positioned to the rear portion of the display panel 20, a pair of light source units 50 disposed to opposite sides of the light guide plate 40, a pair of light source covers 60 surrounding the opposing pair light source units 50, a reflecting plate 45 positioned to a lower part of the light guide plate 40, and a driving unit 80 connected to the display panel 20. A chassis 10 is positioned in front of the display panel 20 and a mold unit 70 is positioned in back of the reflecting plate 45. The display panel 20, the optical film unit 30, the light guide plate 40, the reflecting plate 45, etc., are coupled by the mold unit 70 and the chassis 10 to form a single module.

The chassis 10 is provided in front of the display panel 20, and is coupled with the mold unit 70 to interpose the display panel 20, the optical film unit 30, the light guide plate 40, the reflecting plate 45, etc., therebetween. The chassis 10 is formed around a circumference of the display panel 20, and is formed of a metal material having conductivity and strength to support the display panel 20, etc. The chassis 10 is not limited thereto. For example, alternatively, the chassis 10 may be formed of various materials, having at least one area having conductivity to be connected with a circuit board 90 of the driving unit 80 to perform a grounding function.

The display panel 20 includes a lower substrate 21 formed with a plurality of thin film transistors, and an upper substrate 22 facing the lower substrate 21. A liquid crystal layer (not shown) is positioned between the substrates 21 and 22. The display panel 20 adjusts arrangements of liquid crystal molecules of the liquid crystal layer to form an image. Since the thin film transistors of the display panel 20 are non light emissive elements, the display panel 20 includes the light source units 50.

The driving unit 80 is connected with the lower substrate 21 to apply data signals to the lower substrate 21. The driving unit 80 includes a flexible printed circuit board (FPC) 81, a driving chip 85 mounted on the flexible printed circuit board 81, and a circuit board 90 connected to a side of the flexible printed circuit board 81. The circuit board 90 applies the data signals to the display panel 20, and is positioned to a rear surface of the mold unit 70 by bending of the flexible printed circuit board 81.

The driving unit 80 represents a chip on film (COF) type device. Alternatively, other types of driving units, such as a tape carrier package (TCP), a chip on glass (COG), etc., may be implemented. Also, the driving unit 80 may be mounted on the lower substrate 21.

The optical film unit 30 positioned to the rear portion of the display panel 20 includes a diffusing film 31, a prism film 32, and a protecting film 33. The configuration of the optical film unit 30 is not limited thereto, and may further include a reflecting polarizing film, etc.

The light guide plate 40 is manufactured of an acryl series resin such as polymethylmethacrylate, and uniformly supplies the light from the light source units 50 to the diffusing film 31.

The light source units 50 are positioned to the opposite sides of the light guide plate 40. Each light source unit 50 may include a cold cathode fluorescent lamp (CCFL), or an external electrode fluorescent lamp (EEFL).

The light source covers 60 surround the light source units 50, and reflect the light from the light source units 50 toward the light guide plate 40. The light source covers 60 may be manufactured of aluminum, etc.

The light guide plate 40, the light source units 50, and the light source covers 60 described above are exemplarily provided as an edge type backlight. Alternatively, the a direct type backlight may be implemented. Each of the light source units 50 may include at least one light emitting diodes.

The reflecting plate 45 may be formed of polyethyleneterephthalate (PET) or polycarbonate (PC), and may be coated with silver or aluminum.

As shown in FIG. 2, a conductive member 110 is connected to the circuit board 90 and positioned to the rear portion of the mold unit 70. The conductive member 110 connects a connector 100 mounted on the circuit board 90, an exposed grounding unit 93 formed on the circuit board 90, and the chassis 10. The connector 100 is connected to a signal cable 130 applying external signals to supply image signals to the circuit board 90 (referring to FIG. 3).

Hereinafter, the circuit board 90 and the configuration attached to the circuit board 90 will be described in detail by referring to FIGS. 3 and 4.

Figure 3:
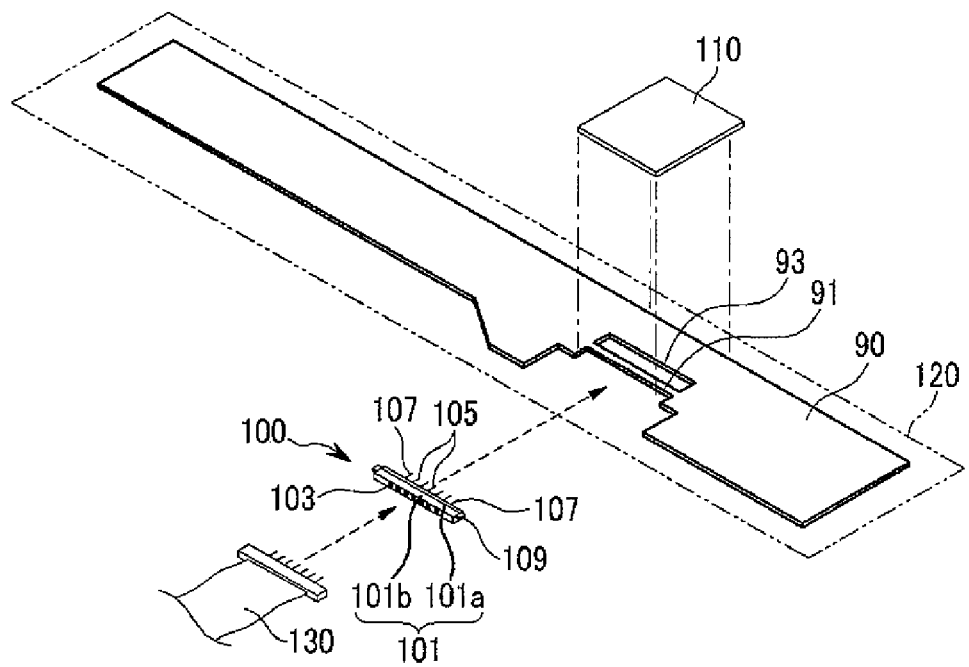
FIG. 3 is a partial exploded perspective view of the display device in FIG. 2.
Figure 4:
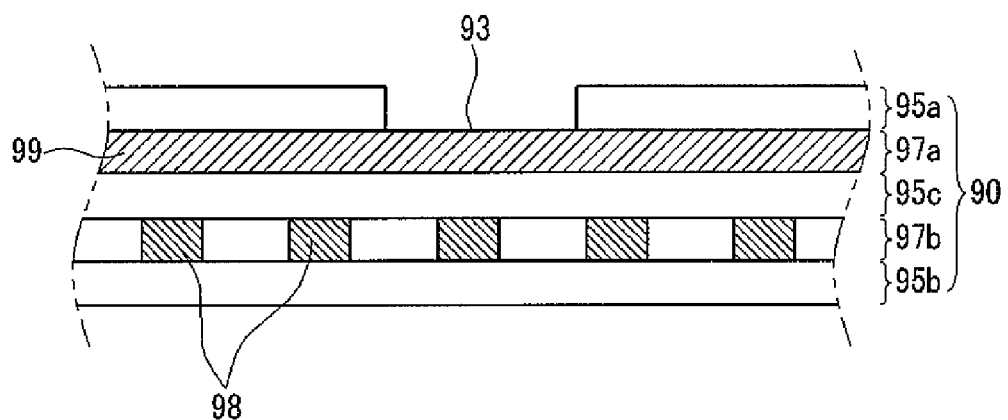
FIG. 4 is a sectional view of a circuit board taken along line IV-IV in FIG. 3.

FIG. 3 is a partial exploded perspective view of the display device 1 shown in FIG. 1, and FIG. 4 is a sectional view of the circuit board 90 taken along line IV-IV in FIG. 2.

Referring to FIG. 4, the circuit board 90 includes signal wirings 98 connected to the display panel 20 to apply the data signals to the display panel 20, and a grounding wiring 99 for grounding. The circuit substrate 90 includes a plurality of metal layers. The circuit board 90 according to an exemplary embodiment includes two metal layers 97a and 97b. The circuit board 90 includes a first insulating layer 95a formed farthest from the mold unit 70 among layers of the circuit board 90, a first metal layer 97a provided to a lower side of the first insulating layer 95a, a middle insulating layer 95c provided to a lower side of the first metal layer 97a, a second metal layer 97b provide to a lower side of the middle insulating layer 95c, and a second insulating layer 95b provided to a lower side of the second metal layer 97b. The circuit board 90 is not limited thereto. The circuit board 90 may include a one or more metal layers. A plurality of electric components (not shown) provided as an integrated circuit (IC) chip are mounted on the circuit board 90 to control image signals, etc. applied from the signal cable 130 (see FIG. 3). The electric components are positioned on the first insulating layer 95a or the second insulating layer 95b, and are connected with at least one of the first metal layer 97a and the second metal layer 97b. A connector connecting unit 91 is formed on the circuit board 90 to support the connector 100.

All of the signal wirings 98 and the grounding wiring 99 connected with the electric components may be formed in the first metal layer 97a and the second metal layer 97b. However, as shown in FIG. 4, in case of the circuit board 90 adjacent to the connector connecting unit 91, the grounding wiring 99 is formed in the first metal layer 97a, and the signal wiring 98 is formed in the second metal layer 97b.

In an exemplary embodiment of FIGS. 1-4, the connector connecting unit 91 is formed to the opposite to the flexible printed circuit board 81 with respect to the circuit board 90. The connector connecting unit 91 is not limited thereto. Alternatively, the connector connecting unit 91 may be provided to other areas of the circuit board 90. As shown in FIG. 3, the connector connecting unit 91 is formed as a recess in a side of the circuit board 90 to accommodate the connector 100. Accordingly, compared with a case that the connector 100 is formed to be layered on the circuit board 90, the connector connecting unit 91 is formed to accommodate the connector 100 so that the thickness of the display device 1 can be reduced. However, the connector connecting unit 91 may be formed on the circuit board 90 to support the connector 100.

A first side of the connector 100 is provided to be connected to the signal cable 130, and a second side thereof is connected to the signal wirings 98 and the grounding wiring 99. The connector 100 includes a housing 101, at least a part of which is formed of a conductive material, connecting terminals 103 provided to be connected with the signal cable 130, signal pins 105 connected to the signal wirings 98 of the circuit board 90, and a grounding pin 107 connected with the grounding wiring 99 of the circuit board 90 and the conducting material of the housing 101. A supporting unit 109 at the opposite sides of the connector 100 for interfacing with the connector connecting unit 91 is coupled to the connector 100 by means of a soldering method, etc.

The housing 101 is formed to an outer side of the connector 100 to support the connecting terminals 103, the signal pin 105 and the grounding pin 107. The housing 101 includes an insulating body 101a formed of an insulating material supporting the connecting terminals 103, the signal pins 105 and the grounding pin 107, and a conductive body 101b formed of a conductive material connected with the grounding pin 107. Also, first sides of the signal pins 105 and the grounding pin 107 are respectively connected with the connecting terminals 103, and second sides thereof are respectively connected to the signal wirings 98 and the grounding wiring 99 of the circuit board 90.

The insulating body 101a prevents electricity from flowing between the signal pins 105 and the grounding pin 107. The conductive body 101b is connected with the grounding pin 107, and is connected with the chassis 10 (see FIG. 1) by the conductive member 110.

The display device 1 of FIG. 1 further includes the exposed grounding unit 93 in which a part of the grounding wiring 99 is exposed on the circuit board 90 adjacent to the connector 100, and the conductive member 110 connecting the exposed grounding unit 93 with the chassis 10. Also, the display device 1 further includes an insulating member 120 provided between the circuit board 90 and the conductive member 110.

The exposed grounding unit 93 is formed by not forming or by removing a part of the insulating layer 95a on the grounding wiring 99 of the circuit board 90 adjacent to the connector 100 to expose a part of the grounding wiring 99. The grounding wiring 99 formed with the exposed grounding unit 93 is formed in the first metal layer 97a most adjacent to the conductive member 110. Since the grounding wiring 99 adjacent to the connector 100 is formed in the first metal layer 97a which is the most outer metal layer, only the first insulating layer 95a is not formed or removed to expose grounding unit 93. Alternatively, the grounding wiring 99 adjacent to the connector 100 may be formed in the second metal layer 97b.

According to an exemplary embodiment, the exposed grounding unit 93 has a tetragonal shape. That is, the width of the exposed grounding unit 93 is about 4 mm, and the length thereof is about 36 mm. Alternatively, the exposed grounding unit 93 may have a circular shape, an oval shape, other polygonal shape, etc., so that the conductive member 110 can contact thereto. The exposed grounding unit 93 may have a sufficient area so that the conductive member 110 can contact thereto. According to an exemplary embodiment, the exposed grounding unit 93 is similar to a plane area of the connector 100. Alternatively, the exposed grounding unit 93 may be bigger than the plane area of the connector 100 to obtain such an area as to contact with the conductive member 110. Alternatively, the exposed grounding unit 93 may be smaller than the plane area of the connector 100 as long as the conductive member 110 can contact thereto.

According to an exemplary embodiment, the conductive member 110 includes an aluminum tape. The conductive member 110 is provided as the aluminum tape electrically connecting the exposed grounding unit 93, the conductive body 101b of the housing 101 and the chassis 10. Accordingly, the aluminum tape which is the conductive member 110 is connected to the exposed grounding unit 93, the conductive body 101b of the housing 101 and the chassis 10. The conductive member 110 is not limited thereto. The conductive member 110 may be provided as a tape or a conductive member having various materials such as a copper tape electrically connecting the exposed grounding unit 93, the conductive body 101b of the housing 101 and the chassis 10. With this configuration, the connector 100 and the grounding wiring 99 adjacent to the connector 100 can be directly grounded to the chassis 10.

The insulating member 120 is attached to a surface of the circuit board 90 positioned between the exposed grounding unit 93 and the chassis 10. According to an exemplary embodiment, the insulating member 120 is attached to a surface of the circuit board 90 and an area of the mold unit 70, except the exposed grounding unit 93 and the connector 100, to attach the circuit board 90 to the mold unit 70. Accordingly, the conductive member 110 is substantially insulated from the electric components (not shown), etc. mounted on the circuit board 90 by means of the insulating member 120, and the circuit board 90 can be attached to the mold unit 70. According to an exemplary embodiment, the insulating member 120 includes a transparent insulating tape attaching the circuit board 90 to a rear surface of the mold unit 70. According to an exemplary embodiment, the insulating member 120 is an insulating tape such as a transparent adhesive tape. The insulating member 120 is not limited thereto. Alternatively, the insulating member 120 may be formed of various materials insulating between the conductive member 110 and the circuit board 90, and attaching the circuit board 90 to the mold unit 70.

Figure 5:
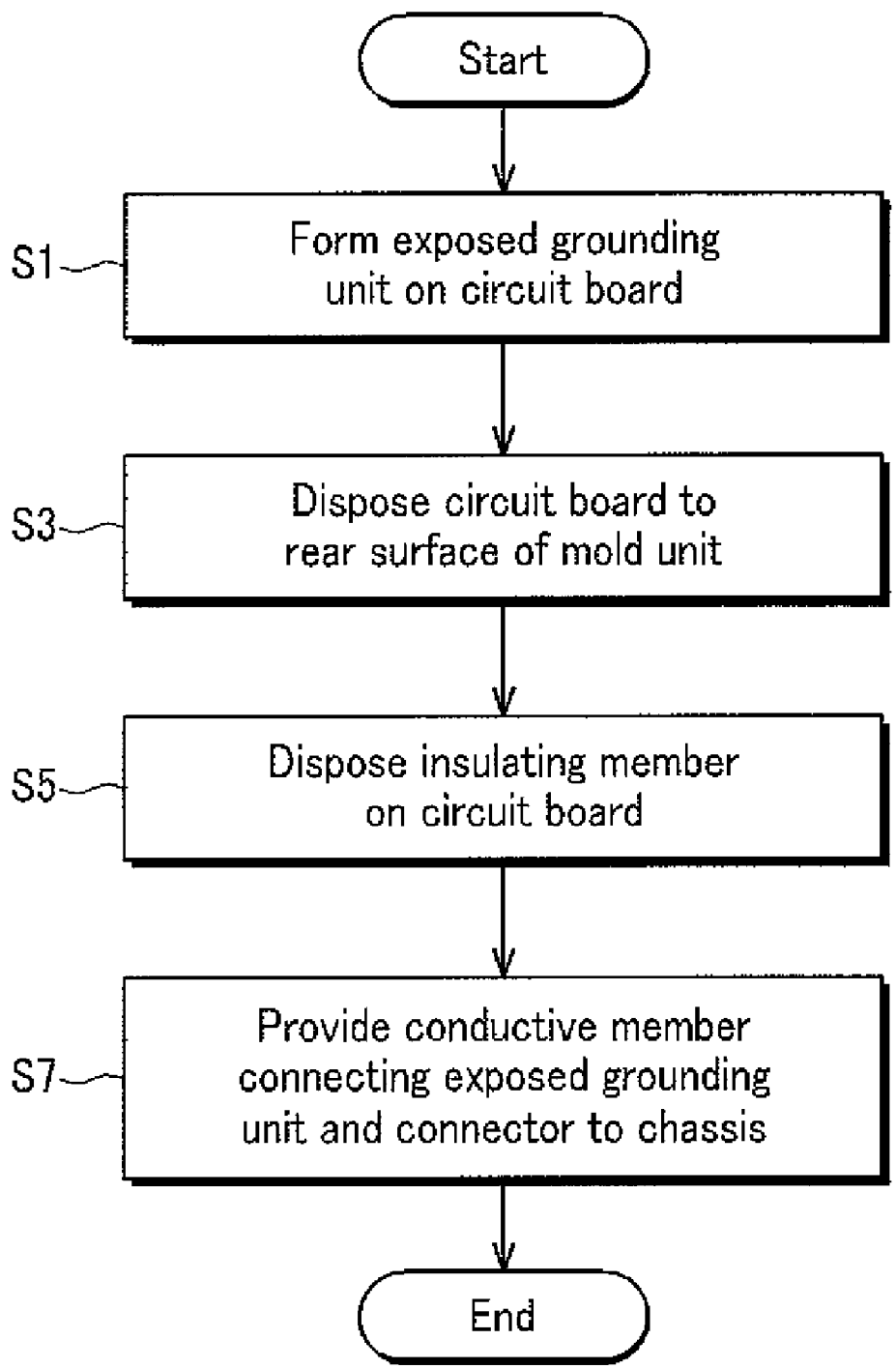
FIG. 5 is a flowchart illustrating a manufacturing process of the display device in FIG. 1.

FIG. 5 is a flowchart illustrating a manufacturing process of the display device 1 of FIGS. 1-4. Hereinafter, a manufacturing method of the display device 1 will be described by referring thereto.

The display panel 20, the circuit board 90 connected with the display panel 20, and the connector 100 mounted on the circuit board 90 are respectively provided, and a part of the grounding wiring 99 of the circuit board 90 is exposed adjacent to the connector 100 on the circuit board 90 to form the exposed grounding unit 93 (S1). After the connector 100 is mounted on the circuit board 90, and the circuit board 90 mounted with the connector 100 is connected to the display panel 20, the chassis 10 is provided in front of the display panel 20, the mold unit 70 is provided in rear of the display panel 20, and the circuit board 90 is disposed to a rear surface of the mold unit 70 (S3). The insulating member 120 is disposed on the circuit board 90 positioned between the exposed grounding unit 93 and the chassis 10. The insulating member 120 is an insulating tape to be attached to a surface of the circuit board 90 and an area of the mold unit 70, except the exposed grounding unit 93, contacting the conductive member 110 and the connector 100 to attach the circuit board 90 to the mold unit 70. The conductive member 110 connecting the exposed grounding unit 93 and the connector 100 with the chassis 10 is provided (S9). The conductive member 110 according to an exemplary embodiment is an aluminum tape to be attached to the exposed grounding unit 93, the conductive body 101*b* of the housing 101 and the chassis 10 to electrically connect the exposed grounding unit 93, the conductive body 101*b* of the housing 101 and the chassis 10.

The order of the manufacturing process described above is exemplarily described according to FIGS. 1-4. Alternatively, the order of the manufacturing process may vary depending on a manufacturing environment or a manufacturing technology.

With the exemplary configuration of FIGS. 1-5, the display device uses the conductive member to direct ground the connector and the exposed grounding unit to the chassis, thereby substantially blocking an electromagnetic interference (EMI), etc., which is generated when the signal cable applying external signals is connected to the connector of the circuit board.

Also, the display device according to an exemplary embodiment of FIGS. 1-5 uses the insulating member to substantially prevent the conductive member from being electrically connected with the electric components, etc. mounted on the circuit board, and to attach the circuit board to the mold unit.

Figure 6:
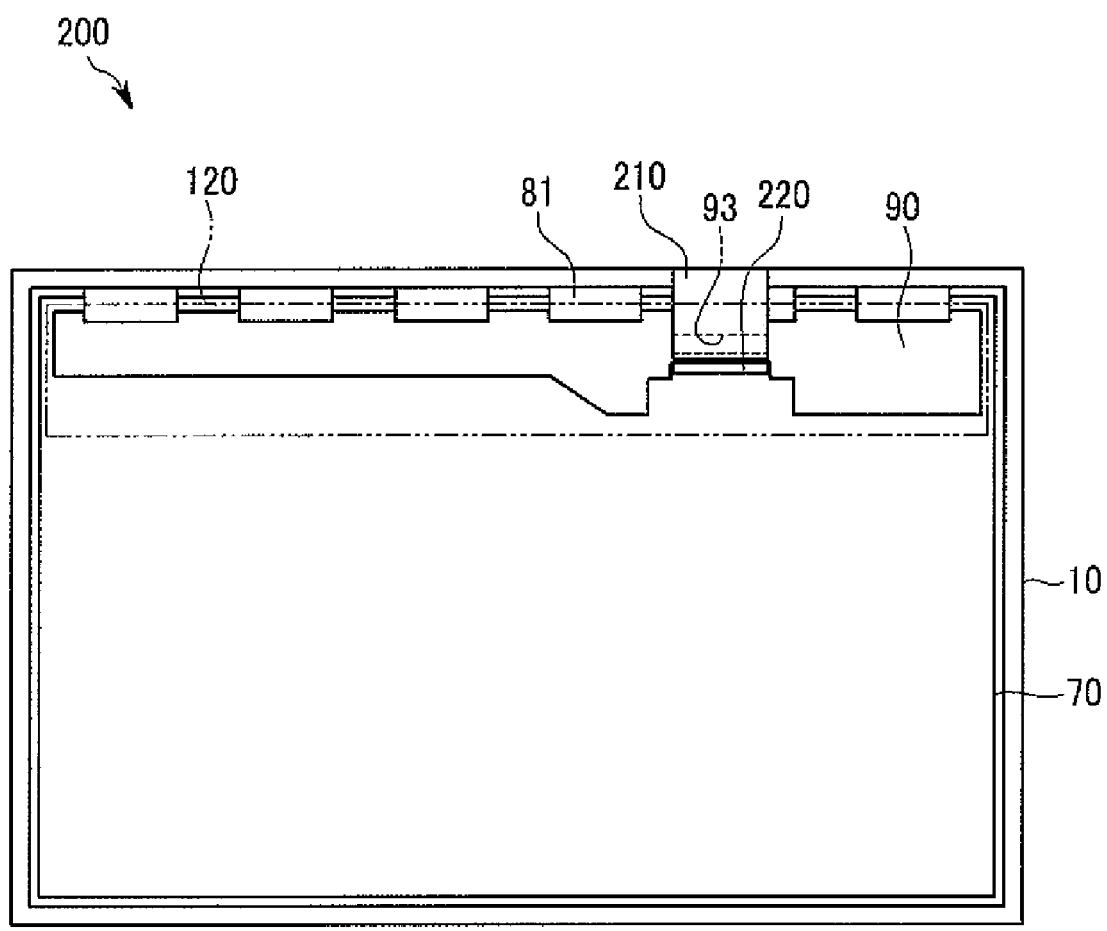
FIG. 6 is a rear view of a display device according to another exemplary embodiment of the present invention.

FIG. 6 is a rear view of a display device according to another exemplary embodiment of the present invention.

As compared with FIGS. 1 to 5, the elements performing the same operations are indicated as the same reference numerals, and the detailed description thereof is omitted.

In the display device 200 of FIG. 6, a circuit board 90 is disposed to a rear surface of a mold unit 70 to be attached by an insulating member 120. A conductive member 210 provided to the display device 200 electrically connects an exposed grounding unit 93 and a chassis 10, and does not connect a connector 220.

When the connector 220 is not formed of a conductive material, or when a plane area of the connector 220 is too small to attach the conductive member 210, the conductive member 210 is not electrically connected with the connector 220.

Also, a signal cable 130 (see FIGS. 3 and 8) being connected with the connector 220 may electrically contact the conductive member 210 when the plane area of the connector 220 is small and the conductive member 210 is not electrically connected with the connector 220.

With this configuration, the display device 200 of FIG. 6 uses the conductive member 210 to directly ground the exposed grounding unit to the chassis, thereby substantially blocking an electromagnetic interference (EMI), etc., which is generated when the signal cable applying external signals is connected to the connector of the circuit board.

Figure 7:
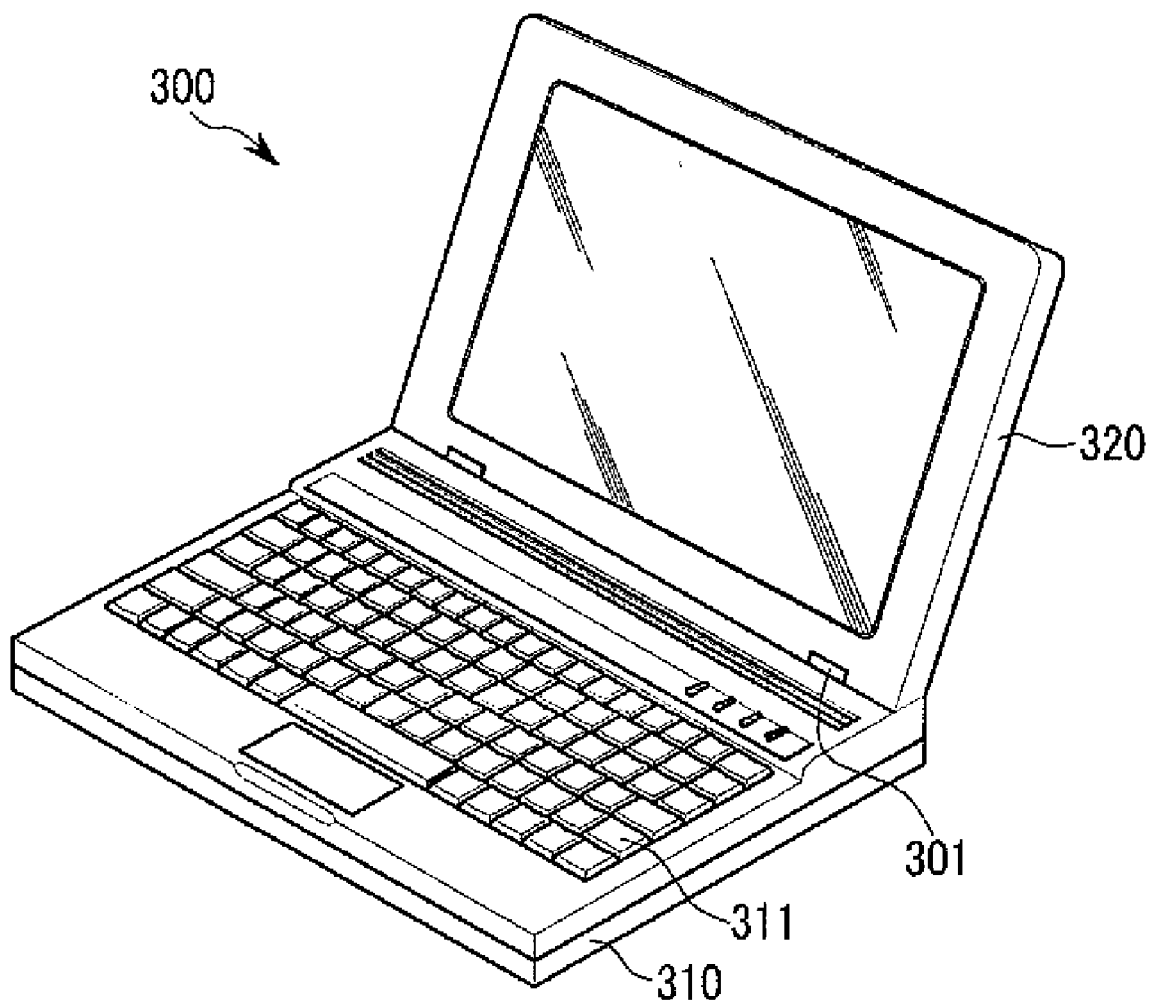
FIG. 7 is a perspective view of a portable computer mounted with a display device according to exemplary embodiments of the present invention.
Figure 8:
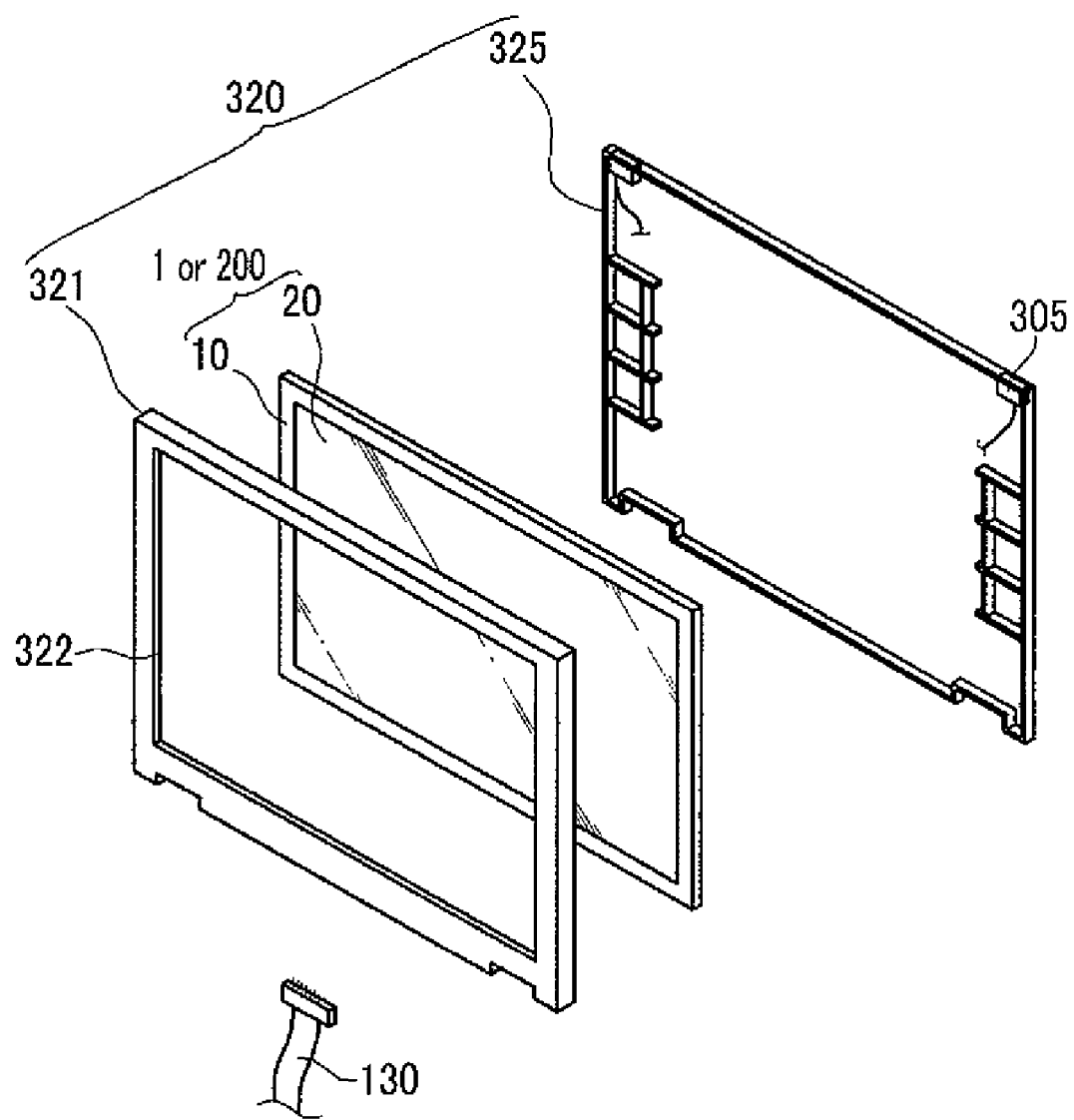
FIG. 8 is a partial exploded perspective view of the portable computer in FIG. 7.

FIGS. 7 and 8 are a perspective view and a partial exploded perspective view of a portable computer mounted with a display device according to exemplary embodiments of the present invention. Hereinafter, the portable computer mounted with the display device will be described by referring thereto. The display device mounted to the portable computer may have the same configuration as the display devices as shown in FIGS. 1-4 and 6.

A portable computer 300 includes a computer main body 310, and a display unit 320 rotatably coupled to the computer main body 310.

The computer main body 310 includes electric components (not shown) such as a central processing unit (CPU) and a memory device mounted therein, and an input device such as a keyboard 311. The computer main body 310 is coupled with the display unit 320 by hinge units 301 to be rotatably coupled with the display unit 320. A signal cable 130 extending from the computer main body 310 is provided to the computer main body 310.

The signal cable 130 is connected to a connector 100 or 220 provided to a rear surface of a display device 1 or 200 to supply image signals to a circuit board 90 from the computer main body 310. The signal cable 130 is connected to the computer main body 310 through the hinge units 301, and this connecting configuration may employ a known technology.

The display unit 320 includes the display device 1 or 200 for displaying an image, a front cover 321 provided to a front side of the display device 1 or 200, and a rear cover 325 provided to a rear side of the display device 1 or 200.

An opening unit 322 is provided to the front cover 321 to expose a display area of a display panel 20. The front cover 321 blocks a circumference around the display panel 20, and is coupled with the rear cover 325 by a screw, a hook, etc.

An antenna 305 is provided to the display unit 320 between the front cover 231 and the rear cover 325. The portable computer 300 uses the antenna 305 to be connected to an internet, etc. through a wireless wide area network (WWAN), etc. The antenna 305 is disposed to an upper side of the display device 1 or 200 of the display unit 320. Alternatively, the antenna 305 may be disposed to a side or a lower side of the display device 1 or 200, and may be disposed in the computer main body 310. The configuration and function of this antenna 305 may employ a known technology.

With this configuration, like the display device describe above, the portable computer according to exemplary embodiments of the present invention uses the conductive member to direct ground the connector and the exposed grounding unit to the chassis, thereby substantially blocking an electromagnetic interference (EMI), etc., which is generated when the signal cable applying external signals is connected to the connector of the circuit board to reduce noise detected by the antenna.

When the signal cable transmits data to the circuit board through a low voltage differential signaling (LVDS) type which is a graphic data transmission type applied to a portable computer, the portable computer according to an present exemplary embodiment can substantially block an electromagnetic interference (EMI) in various frequency bands such as about 850 Mhz, about 99 Mhz, about 1.8 Ghz, about 1.9 Ghz, about 2.1 Ghz, etc., which are applied to a portable telephone, thereby reducing noise.

According to exemplary embodiments of the present invention, noise caused due to a connector connected with a signal cable can be reduced.

Although exemplary embodiments of the present invention have been shown and described, it will be appreciated by those skilled in the art that changes may be made in exemplary embodiments without departing from the principles and spirit of the invention, the scope of which is defined in the appended claims and their equivalents.

What is claimed is:

1. A display device, comprising:
    a display panel;
    a chassis supporting the display panel, and comprises a conductive material;
    a circuit board comprising a signal wiring connected to the display panel to apply a data signal to the display panel, and a grounding wiring for grounding;
    a connector connected to a signal cable that applies an external signal, and is connected to the signal wiring and the grounding wiring of the circuit board;
    an exposed grounding unit exposing part of the grounding wiring on the circuit board, wherein the exposed grounding unit is disposed adjacent to the connector; and
    a conductive member which connects the exposed grounding unit with the chassis,
    wherein the connector comprises a housing, wherein at least a part of the housing is formed of a conductive material,
    wherein the conductive member is connected with the conductive material of the housing,
    wherein the circuit board comprises a plurality of metal layers, and
    wherein the grounding wiring, which is formed with the exposed grounding unit, is formed in a metal layer of the plurality of metal layers which is most adjacent to the conductive member.

2. The display device of claim 1, wherein the connector further comprises a grounding pin which is connected with the grounding wiring of the circuit board and the conductive material of the housing.

3. The display device of claim 1, wherein the conductive member comprises an aluminum tape.

4. The display device of claim 1, further comprising an insulating member provided between the circuit board and the conductive member.

5. The display device of claim 4, further comprising a mold unit provided to a rear side of the display panel to support the display panel,
    wherein the insulating member comprises an insulating tape connecting the circuit board to a rear surface of the mold unit.

6. The display device of claim 1, wherein an area of the exposed grounding unit is greater than or equal to an area of a rear surface of the connector.

7. The display device of claim 1, wherein the chassis is formed along a circumference around the display panel.

8. A manufacturing method of a display device, comprising:
    providing a display panel, a circuit board which is connected with the display panel, and a connector which is mounted on the circuit board, and an exposed grounding unit on the circuit board exposing a part of a grounding wiring of the circuit board adjacent to the connector;
    providing a mold unit to a rear side of the display panel, and disposing the circuit board to a rear surface of the mold unit;
    disposing an insulating member on the circuit board, the insulating member disposed between the exposed grounding unit and a chassis supporting the display panel; and
    providing a conducting member connecting the chassis and the exposed grounding unit
    wherein the connector comprises a housing, wherein at least a part of the housing is formed of a conductive material,
    wherein the manufacturing method further comprises connecting the conductive member with the conductive material of the housing,
    wherein the circuit board comprises a plurality of metal layers, and
    wherein the grounding wiring, which is formed with the exposed grounding unit, is formed in a metal layer of the plurality of metal layers which is most adjacent to the conductive member.

9. The manufacturing method of claim 8, wherein the insulating member comprises an insulating tape attached to the circuit board and a rear surface of the mold unit wherein the connector and the exposed grounding unit is exposed.

10. A portable computer, comprising:
    a computer main body;
    a display unit rotatably coupled to the computer main body;
    a signal cable extending from the computer main body; and
    a display device mounted to the display,
    the display device comprising:
    a display panel;
    a chassis supporting the display panel, and comprises a conductive material;
    a circuit board comprising a signal wiring which is connected to the display panel to apply a driving signal to the display panel, and a grounding wiring for grounding;

a connector provided to the signal cable, and is connected to the signal wiring and the grounding wiring of the circuit board;

an exposed grounding unit exposing part of the grounding wiring on the circuit board, wherein the exposed grounding unit is disposed adjacent to the connector; and a conductive member which connects the exposed grounding unit with the chassis, wherein the connector comprises a housing, wherein at least a part of the housing is formed of a conductive material, wherein the conductive member is connected with the conductive material of the housing, wherein the circuit board comprises a plurality of metal layers, and the grounding wiring, which is formed with the exposed grounding unit, is formed in a metal layer of the plurality of metal layers which is most adjacent to the conductive member.

11. The portable computer of claim 10, wherein the connector further comprises:

a connecting terminal connected with the signal cable;

a signal pin connected to the signal wiring of the circuit board; and a grounding pin connected with the grounding wiring of the circuit board and the conductive material of the housing.

12. The portable computer of claim 10, wherein the conductive member comprises an aluminum tape.

13. The portable computer of claim 10, further comprising an insulating member provided between the circuit board and the conductive member.

14. The portable computer of claim 13, further comprising a mold unit which is provided to a rear side of the display panel, the mold unit supporting the display panel, wherein the insulating member comprises an insulating tape connecting the circuit board to a rear surface of the mold unit.

* * * * *